United States Patent
Suehiro et al.

(10) Patent No.: US 7,319,289 B2
(45) Date of Patent: Jan. 15, 2008

(54) LIGHT EMITTING DEVICE

(75) Inventors: Yoshinobu Suehiro, Aichi-ken (JP); Mitsuhiro Inoue, Aichi-ken (JP); Hideaki Kato, Aichi-ken (JP); Tohru Terajima, Saitama-ken (JP); Kazuya Aida, Saitama-ken (JP); Naruhito Sawanobori, Saitama-ken (JP)

(73) Assignees: Toyoda Gosei Co., Ltd., Nishikasugai-Gun, Aichi-Ken (JP); Sumita Optical Glass, Inc., Saitama-Ken (JP)

( * ) Notice: Subject to any disclaimer, the term of this patent is extended or adjusted under 35 U.S.C. 154(b) by 261 days.

(21) Appl. No.: 10/796,302

(22) Filed: Mar. 10, 2004

(65) Prior Publication Data

US 2004/0207998 A1 Oct. 21, 2004

(30) Foreign Application Priority Data

Mar. 10, 2003 (JP) ............................. 2003-063016

(51) Int. Cl.
*H01J 21/00* (2006.01)
*H01J 1/62* (2006.01)
*H01J 63/04* (2006.01)

(52) U.S. Cl. ...................... 313/485; 313/112; 313/478; 313/493; 313/495; 313/512; 313/636; 313/487; 362/260; 362/310; 362/341

(58) Field of Classification Search ................ 313/498, 313/501, 502, 503, 506, 512, 484–487, 493, 313/636, 474, 112, 478; 362/260, 296, 310, 362/341, 307

See application file for complete search history.

(56) References Cited

U.S. PATENT DOCUMENTS

| 4,540,915 | A | * | 9/1985 | Shinkai et al. | ............... | 313/486 |
| 5,122,671 | A | * | 6/1992 | Buchanan et al. | ........ | 250/483.1 |
| 5,635,109 | A | | 6/1997 | Otsuka | | |
| 5,755,998 | A | | 5/1998 | Yamazaki et al. | | |
| 6,265,825 | B1 | * | 7/2001 | Asano | ......................... | 313/582 |
| 6,921,730 | B2 | * | 7/2005 | Atagi et al. | ................... | 501/64 |
| 6,943,380 | B2 | * | 9/2005 | Ota et al. | .................... | 257/100 |
| 2002/0043926 | A1 | | 4/2002 | Takahashi et al. | | |

FOREIGN PATENT DOCUMENTS

| JP | 2001-217466 | | 8/2001 |
| JP | 2002-76434 | | 3/2002 |
| JP | 2002-076434 | * | 3/2002 |
| WO | WO 02054503 A1 | * | 7/2002 |

* cited by examiner

*Primary Examiner*—Ashok Patel
(74) *Attorney, Agent, or Firm*—McGinn IP Law Group, PLLC

(57) ABSTRACT

A light emitting device has a light emitting element, and a phosphor layer of phosphor glass to generate fluorescence while being excited by light emitted from the light emitting element. The light emitting element emits ultraviolet light, and the phosphor glass generates visible fluorescence while being excited by the ultraviolet light.

15 Claims, 6 Drawing Sheets

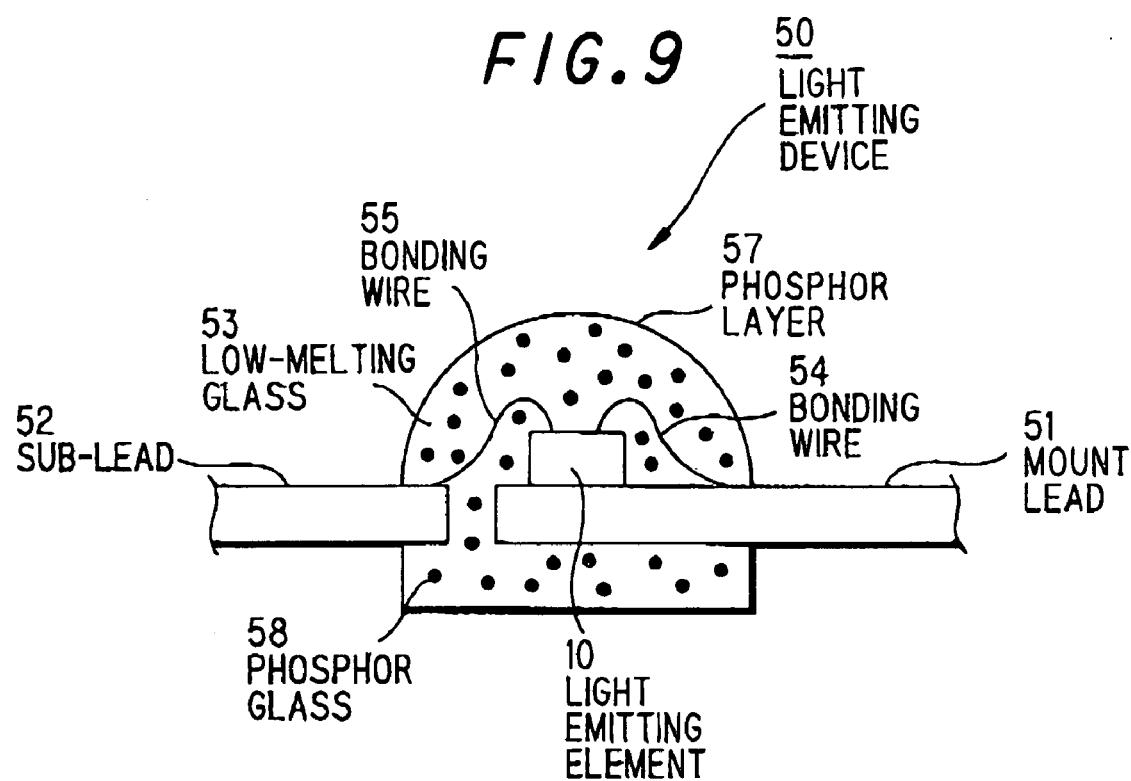
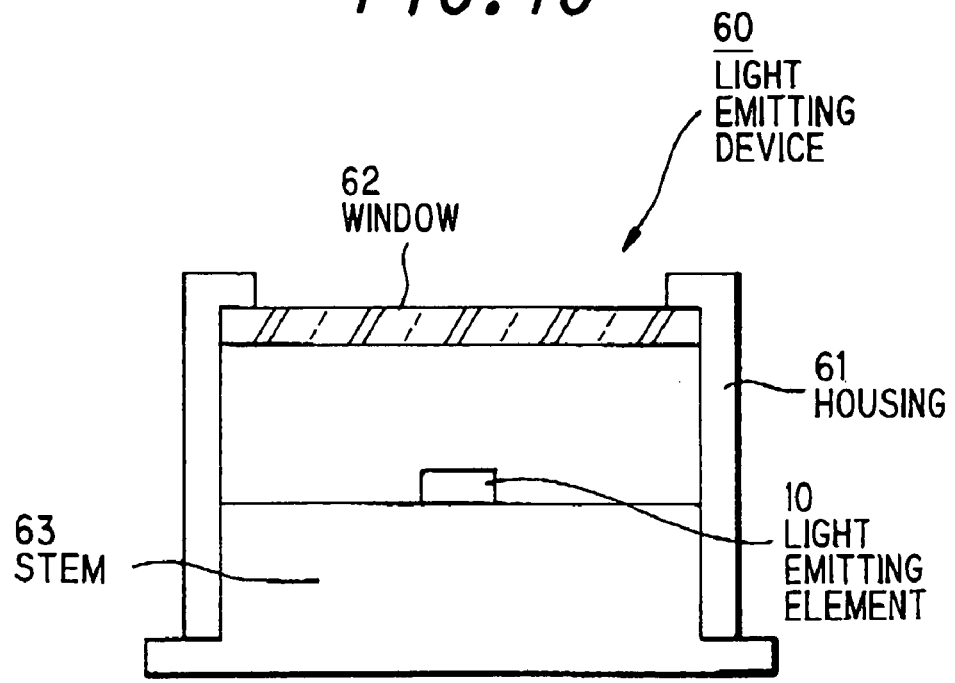

LIGHT EMITTING DEVICE

The present application is based on Japanese patent application No. 2003-063016, the entire contents of which are incorporated herein by reference.

BACKGROUND OF THE INVENTION

1. Field of the Invention

This invention relates to a light emitting device and, particularly, to a light emitting device with a phosphor layer for wavelength-converting light emitted from a light emitting element.

2. Description of the Related Art

Conventionally, a light emitting device is suggested that allows the wavelength conversion of light emitted from a light emitting element by a phosphor material to obtain a desired emission color.

Such a light emitting device is, as shown in FIG. 1, composed of: a board 5; a circuit pattern 4 formed on the board 5; a light emitting element 1 mounted through the circuit pattern 4 on the board 5, the light emitting element 1 being enabled to emit ultraviolet light; a cover 2 that is formed semispherical while covering a light emitting element 1 to emit ultraviolet light, and a phosphor layer 3 that is provided on the inner surface of the cover 2. In the light emitting device, the phosphor material in phosphor layer 3 is excited by ultraviolet light emitted from the light emitting element 1 and, thereby, it radiates, e.g., white light.

Japanese patent application laid-open No. 2001-217466 discloses a light emitting device that its light emitting element is covered with sealing resin material (phosphor layer) with phosphor particles dispersed therein.

However, in the light emitting device as shown in FIG. 1, since the phosphor layer 3 is exposed, the phosphor material may be subjected to degradation due to absorbed moisture. If an air-tight housing is employed to prevent the penetration of water into the cover 2, the manufacturing cost will rise since the light emitting device becomes difficult to assemble. Even in case of dispersing phosphor particles in the sealing resin material as in Japanese patent application laid-open No. 2001-217466, the degradation of phosphor material due to moisture cannot be prevented sufficiently.

Further, since a phosphor material including metal element generally has a high specific density, it may flow by gravitation when being coated on the inner surface of cover 2. Therefore, it is difficult to make the thickness of phosphor layer 3 equal. Thus, it is difficult to generate equal fluorescence over the entire cover 2.

SUMMARY OF THE INVENTION

It is an object of the invention to provide a light emitting device that the degradation of phosphor material due to moisture can be prevented.

It is another object of the invention to provide a light emitting device that equal fluorescence can be obtained over its entire emission surface.

According to the invention, a light emitting device comprises:

a light emitting element; and a phosphor layer that is composed of phosphor glass to generate fluorescence while being excited by light emitted from the light emitting element;

wherein the light emitting element emits ultraviolet light, and the phosphor glass generates visible fluorescence while being excited by the ultraviolet light.

BRIEF DESCRIPTION OF THE DRAWINGS

The preferred embodiments according to the invention will be explained below referring to the drawings, wherein:

FIG. 9 is a cross sectional view showing part of a light emitting device in a fourth preferred embodiment of the invention;

FIG. 10 is a cross sectional view showing a light emitting device in a fifth preferred embodiment of the invention;

DETAILED DESCRIPTION OF THE PREFERRED EMBODIMENTS

Figure 1:
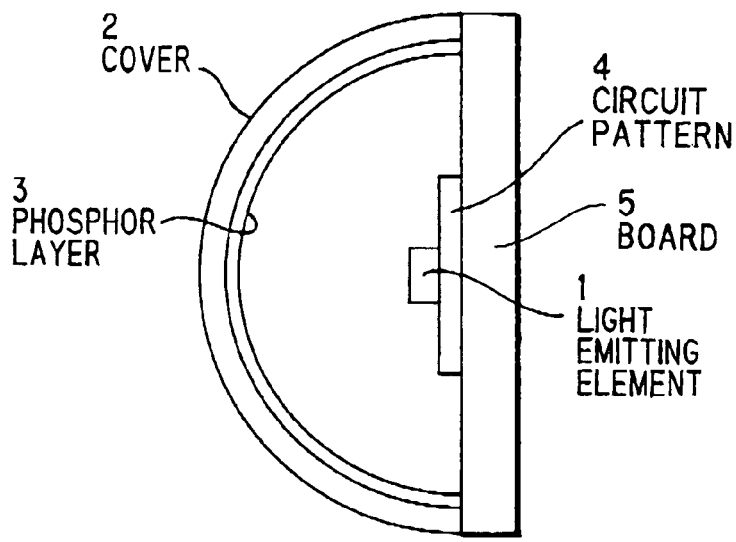
FIG. 1 is a side view showing the conventional light emitting device.

First of all, the components of a light emitting device of the invention are detailed below.

[Light Emitting Element]

The light emitting element includes a light emitting diode, a laser diode or the like. The emission wavelength of light emitting element is not specifically limited. A III group nitride system compound semiconductor element effective for emitting ultraviolet light to green system light can be used.

A light emitting element used for emitting ultraviolet light in the embodiments is III group nitride system compound semiconductor light emitting element. Available III group nitride system compound semiconductors for the III group nitride system compound semiconductor light emitting element are represented by a general formula: $Al_xGa_yIn_{1-X-Y}N$ ($0<X\leq1$, $0\leq Y\leq1$, $0\leq X+Y\leq1$). Those composed of Al include two-element system such as AlN, and three-element system such as $Al_{X1}Ga_{1-X1}N$ and $Al_{X1}In_{1-X1}N$ ($0<x1<1$). In the III group nitride system compound semiconductors and GaN, at least part of III group element may be replaced by boron (B), thallium (Tl) etc. and at least part of nitrogen (N) may be replaced by phosphorous (P), arsenic (As), antimony (Sb), bismuth (Bi) etc.

The III group nitride system compound semiconductor may include an arbitrary dopant (impurity) n-type impurity available is silicon (Si), germanium (Ge), selenium (Se), tellurium (Te), carbon (C) etc. p-type impurity available is magnesium (Mg), zinc (Zn), beryllium (Be), calcium (Ca), strontium (Sr), barium (Ba) etc. After doping p-type impurity, the III group nitride system compound semiconductor can be treated by a known method such as electron beam radiation. annealing and plasma radiation to lower the resistivity, but this treatment is not necessarily needed.

III group nitride system compound semiconductor layer can be formed by MOCVD (metal organic chemical vapor deposition). It is not always necessary to form all semiconductor layers to compose the light emitting element by MOCVD. Instead of or together with MOCVD, molecular beam epitaxy (MBE), hydride vapor phase epitaxy (HVPE), sputtering, ion plating, electron shower etc. may be used.

The light emitting element may include MIS junction, PIN junction or pn-junction included homo-structure, hetero-structure or double hetero-structure. Light emitting layer thereof may include quantum well structure (single quantum well structure or multi-quantum well structure). The III group nitride system compound semiconductor light emitting element may be of a face-up type that main light emission direction (electrode surface) is in the optical axis direction of light emitting device or a flip-chip type that main light emission direction is in the opposite direction to the optical axis direction to use reflected light.

[Phosphor Glass]

Phosphor glass includes a fluorescence activation element as one of glass components. In other words, it is composed such that an element having fluorescence activity, such as a rare-earth element, is doped into a basic glass component such as fluorophosphate.

For example, fluorophosphate phosphor glass, which is disclosed in Japanese patent application laid-open Nos. 8-133780 and 9-202642, and oxide phosphor glass, which is disclosed in Japanese patent application laid-open No. 10-167755 can be used as phosphor glass of the invention.

The phosphor glass is doped with a fluorescence activation element such as $Tb^{3+}$, $Eu^{2+}$ and $Eu^{3+}$. Although the phosphor glass is substantially colorless and transparent under visible light, it generates intensive fluorescence to ultraviolet light in a wide wavelength range. Being irradiated with ultraviolet light. $Tb^{3+}$ generates green system fluorescence, $Eu^{2+}$ generates blue system fluorescence, and $Eu^{3+}$ generates red system fluorescence. Such phosphor glass doped with the fluorescence activation element is commercially available as Lumilass G9, Lumilass B and Lumilass R7 (each registered trade mark) which are manufactured by SUMITA Optical Glass, Inc., one of the assignees.

[Phosphor Layer]

A phosphor layer functions such that it generates fluorescence by being irradiated with light from a light emitting element while wavelength-converting that light to define an emission color of the light emitting device. The phosphor layer is not specifically limited in shape and disposition etc. as far as it can receive light from the light emitting element and discharge fluorescence out of the light emitting device, and it may be suitably designed according to the characteristics of light emitting device.

The phosphor glass described earlier may, by itself, compose the phosphor layer. The fluorescence activation element is evenly contained, as one glass component, in the phosphor glass. Therefore, when the phosphor layer is of phosphor glass, there occurs no unevenness of fluorescence in the phosphor layer. Also, since the fluorescence activation element is incorporated into the glass structure, it can be stabilized to moisture.

The phosphor layer may be composed stacking different kinds of phosphor glass layers. By mixing fluorescence's generated from the phosphor glass layers, the emission color of light emitting device can be arbitrarily controlled. For example, when stacked phosphor glasses of $Tb^{3+}$ (green system fluorescence), $Eu^{2+}$ (blue system fluorescence) and $Eu^{3+}$ (red system fluorescence) are applied to an ultraviolet light emitting element, fluorescence's generated from the phosphor glasses are mixed to produce white light.

The phosphor glass described earlier may be contained (dispersed) in the phosphor layer while being ground into particles or powder. Even if it is used dispersed in resin, the fluorescence characteristic can be maintained for a long period due to its excellent water resistance, as compared to a general phosphor material.

The grinding of phosphor glass can be conducted using a known grinding apparatus such as a ball mill.

Particles of phosphor glass obtained by the grinding are dispersed in a transparent (light-transmitting) material to form the matrix of phosphor layer. Several kinds of phosphor glass particles may be dispersed in the transparent material. Thereby, the emission color of light emitting device can be arbitrarily controlled.

Herein, a particle of phosphor glass means a particle to be obtained by grinding a bulk of phosphor glass, and its shape may be in various forms such as particle, powder and flake.

A known phosphor material may be dispersed in the transparent material. For example, when using alight emitting element to emit ultraviolet light, available with the particle of phosphor glass is any one or a combination of two or more selected from phosphors: ZnS:Cu, Al; (Zn, Cd)S: Cu, Al; ZnS:Cu, Au, Al; $Y_2SiO_5$:Tb; (Zn, Cd)S:Cu; $Gd_2O_2S$: Tb; $Y_2O_2S$:Tb; $Y_3Al_5O_{12}$:Ce; (Zn, Cd)S:Ag; ZnS:Ag, Cu, Ga, Cl; $Y_3Al_5O_{12}$:Tb; $Y_3(Al, Ga)_5O_{12}$:Tb; $Zn_2SiO_4$:Mn; $LaPO_4$:Ce, Tb; $Y_2O_3S$:Eu; $YVO_4$:Eu; ZnS:Mn; $Y_2O_3$:Eu; ZnS:Ag, ZnS:Ag, Al; (Sr, Ca, Ba, $Mg)_{10}(PO_4)_6Cl_2$:Eu; $Sr_{10}(PO_4)_6Cl_2$:Eu; (Ba, Sr, Eu) (Mg, $Mn)Al_{10}O_{17}$; (Ba, Eu)$MgAl_{10}O_{17}$; ZnO:Zn; and $Y_2SiO_5$:Ce.

A second phosphor material may be further combined that can be excited by fluorescence light (a) generated from the phosphor glass and/or phosphor material and can generate fluorescence light (b) with a wavelength different from the fluorescence light (a).

The particle of phosphor glass and/or phosphor material may be evenly dispersed or locally disposed in the transparent material. For example, when the particles of phosphor glass are locally disposed near the light emitting element, light to be emitted from the light emitting element can be effectively wavelength-converted by them.

A light diffusion material can be contained (dispersed) in the transparent material so as to diffuse light in the transparent material. Thereby, unevenness in emission color can be reduced.

The transparent material may be epoxy resin, silicon resin, urea resin, glass etc. Especially, low-melting glass of $SiO_2$—$Nb_2O_5$ system, $B_2O_3$—F system, $P_2O_5$—F system, $P_2O_5$—ZnO system, $SiO_2$—$B_2O_3$—$La_2O_3$ system or $SiO_2$—$B_2O_3$ system is preferable. These low-melting glasses do not contain any harmful element. Thereby, a good work environment in manufacturing process can be easily secured and a load in recycling can be reduced. Since the low-melting glass is chemically stable as compared to resin material, it is not subjected to discoloration such as yellowing. Since temperature in covering the light emitting element with the low-melting glass is controlled to be relatively low, the light emitting element or the other components such as bonding wire is not affected by heat. Further, because of having no resin component, the entire device can secure a high heat resistance. Therefore, the light emitting device can be applied to a heat processing such as solder reflowing.

Of these low-melting glasses, one or two or more to be arbitrarily selected may be used.

According to intended use and use conditions, the concentration distribution of phosphor glass particles in the transparent material may be changed. Namely, the amount of phosphor glass particles may be varied sequentially or stepwise with being close to the light emitting element. For example, the concentration of phosphor glass particles can be increased near the light emitting element. Thereby, light from the light emitting element can be irradiated to phosphor glass particles. If concentration of phosphor glass particles is reduced with being close to the light emitting element, the degradation of phosphor glass particles due to heat from the light emitting element can be prevented.

Between phosphor material and light emitting element, a layer of another transparent material or a space may be provided.

First Embodiment

Figure 2:
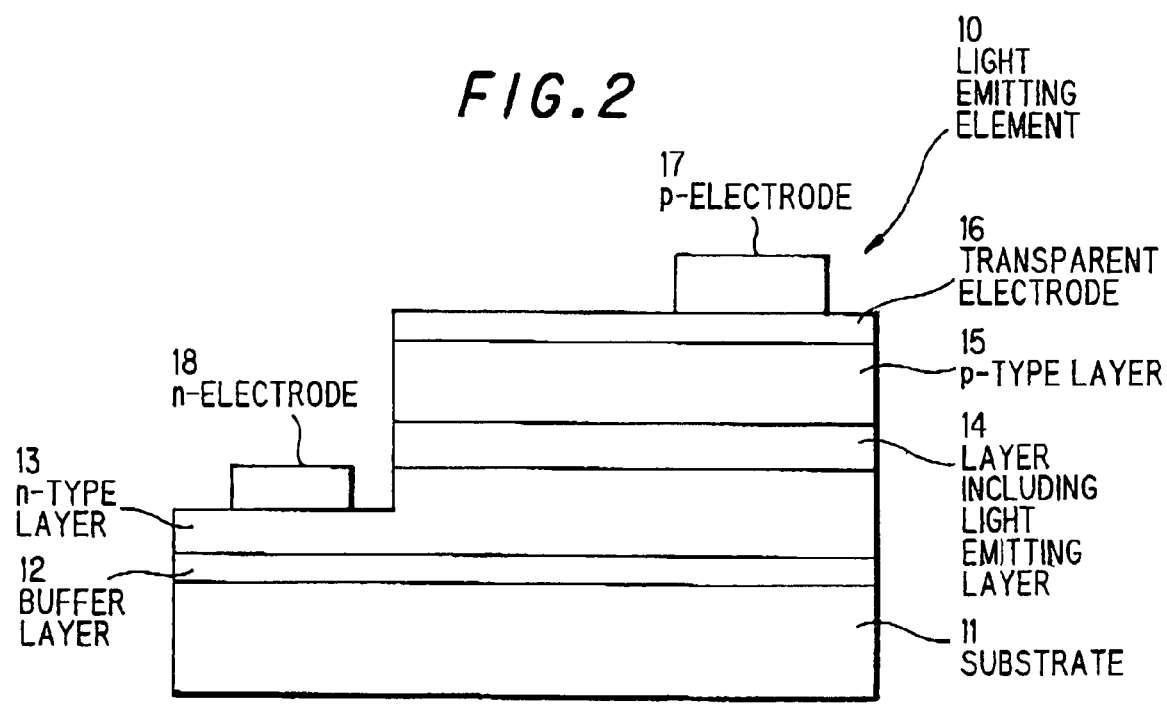
FIG. 2 is a cross sectional view showing a light emitting element 10 used in preferred embodiments of the invention.

FIG. 2 is a cross sectional view showing a light emitting element 10 used in the preferred embodiments of the invention.

In this embodiment, a face-up type III group nitride system compound semiconductor light emitting element 10 as shown in FIG. 2 is used. The light emitting element 10 emits ultraviolet light. The details of layers to compose the light emitting element 10 are as follows:

| Layers | Composition |
| --- | --- |
| p-type layer 15 | p-GaN:Mg |
| layer 14 including light emitting layer | InGaN layer included |
| n-type layer 13 | n-GaN:Si |
| buffer layer 12 | AlN |
| substrate 11 | sapphire |

The emission wavelength of light emitting element 10 can be adjusted by controlling the composition ratio of III group element in layer 14 including light emitting layer. Alternatively, a flip-chip type light emitting element may be used that a thick p-electrode to cover the surface of p-type layer 15 is provided instead of a transparent electrode 16 and p-electrode 17.

n-type layer 13 of GaN with n-type impurity Si doped is grown through buffer layer 12 on the substrate 11. Although the substrate 11 is of sapphire in this embodiment, it may be, instead, of spinel, silicon carbide, zinc oxide, magnesium oxide, manganese oxide, zirconium boride or III group nitride system compound semiconductor single crystal etc. The buffer layer 12 of AlN is grown by MOCVD. It may be of GaN, InN, AlGaN, InGaN, AlGaInN etc. and may be grown by molecular beam epitaxy (MBE), hydride vapor phase epitaxy (HVPE), sputtering, ion plating etc. when the substrate 11 is of III group nitride system compound semiconductor, the buffer layer can be omitted.

Meanwhile, the substrate and buffer layer can be removed after forming the semiconductor element, when needed.

Although n-type layer 13 is of GaN, it may be of AlGaN, InGaN or AlInGaN.

Although n-type impurity Si is doped in the n-type layer 13, the other n-type impurity, e.g. Ge, Se, Te and C may be doped therein.

The layer 14 including light emitting layer can have quantum well structure (multiquantum well structure or single quantum well structure). The structure of light emitting element maybe of single-hetero type, double-hetero type or homo junction type.

The layer 14 including light emitting layer may also include Mg-doped III group nitride system compound semiconductor layer with a large bandgap on the p-type layer 15 side. This prevents electrons injected into the layer 14 including light emitting layer from dispersing into the p-type layer 15.

p-type layer 15 of GaN with p-type impurity Mg doped is grown on the layer 14 including light emitting layer. The p-type layer 15 may be of AlGaN, InGaN or AlInGaN. p-type impurity may be Zn, Be, Ca, Sr or Ba. After doping p-type impurity, the layer 15 can be treated by a known method such as electron beam radiation, annealing and plasma radiation to lower the resistivity, but this treatment is not needed necessarily.

In this embodiment, the III group nitride system compound semiconductor layer is grown, under general conditions, by MOCVD, molecular beam epitaxy (MBE), hydride vapor phase epitaxy (HVPE), sputtering, ion plating etc.

n-type electrode 18 is composed of two layers of Al and V. After growing the p-type layer 15, part of the p-type layer 15, layer 14 including light emitting layer and n-type layer 13 is removed by etching, then forming the n-type electrode 18 on exposed n-type layer 13 by vapor deposition.

Transparent electrode 16 formed on the p-type layer 15 is thin film including gold. Also, p-type electrode 17 formed on the transparent electrode 17 by vapor deposition is of material including gold.

After forming the layers and electrodes as described above, the water is separated into chips.

Figure 3:
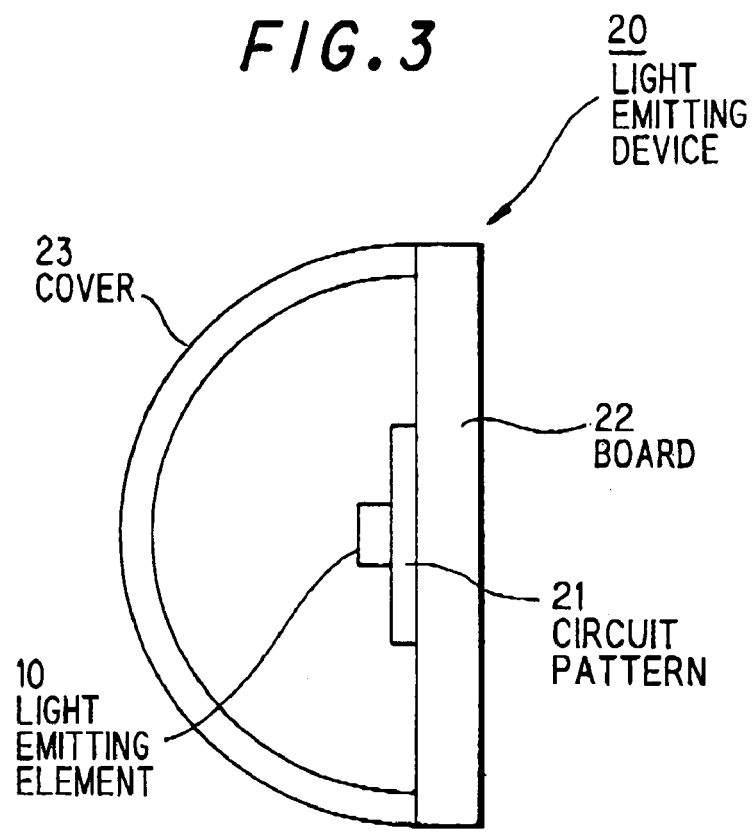
FIG. 3 is a side view showing a light emitting device in a first embodiment of the invention.
Figure 4:
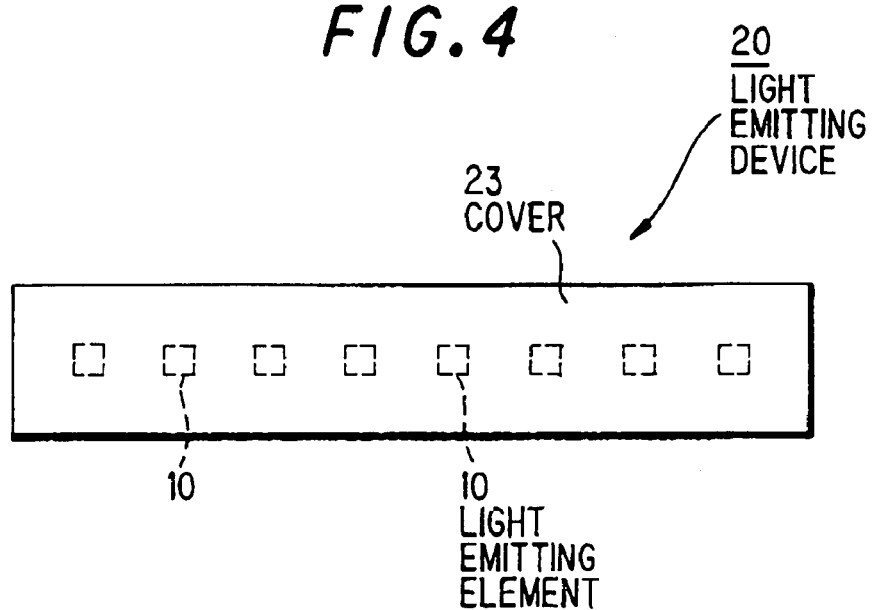
FIG. 4 is a front view showing the light emitting device in FIG. 3.

FIG. 3 is a side view showing a light emitting device 20 in the first embodiment of the invention FIG. 4 is a front view showing the light emitting device in FIG. 3.

The light emitting elements 10 are disposed at equal intervals on a board 22 with a circuit pattern 21 formed thereon. A semicylinder-shaped cover 23 (phosphor layer) is bonded onto the board 22 while covering the light emitting element 10. The cover 23 is of phosphor glass and its both ends are opened. In this embodiment, the phosphor glass is fluorophosphate glass with $Tb^{3+}$ doped therein (Lumilass G9 (registered trade mark): SUMITA Optical Glass, Inc.).

In the light emitting device 20, ultraviolet light emitted from the light emitting element 10 excites phosphor element ($Tb^{3+}$) in the cover 23 to generate green system fluorescence. The phosphor element is evenly doped in phosphor glass to compose the cover 23. Thereby, the fluorescence can be generated evenly and, therefore, unevenness in emission color can be prevented. The phosphor element as part of glass material is not subjected to degradation due to moisture. Thus, the light emitting device has an excellent endurance.

In this embodiment, by varying the amount of phosphor element at the stage of preparing the phosphor glass, the color strength of fluorescence can be controlled. In contrast, with the conventional light emitting device as shown in FIG. 1, the color strength of fluorescence can be controlled by varying the thickness of phosphor material layer. However, it is difficult to finely control the thickness and, therefore, unevenness in thickness may occur.

Second Embodiment

Figure 5:
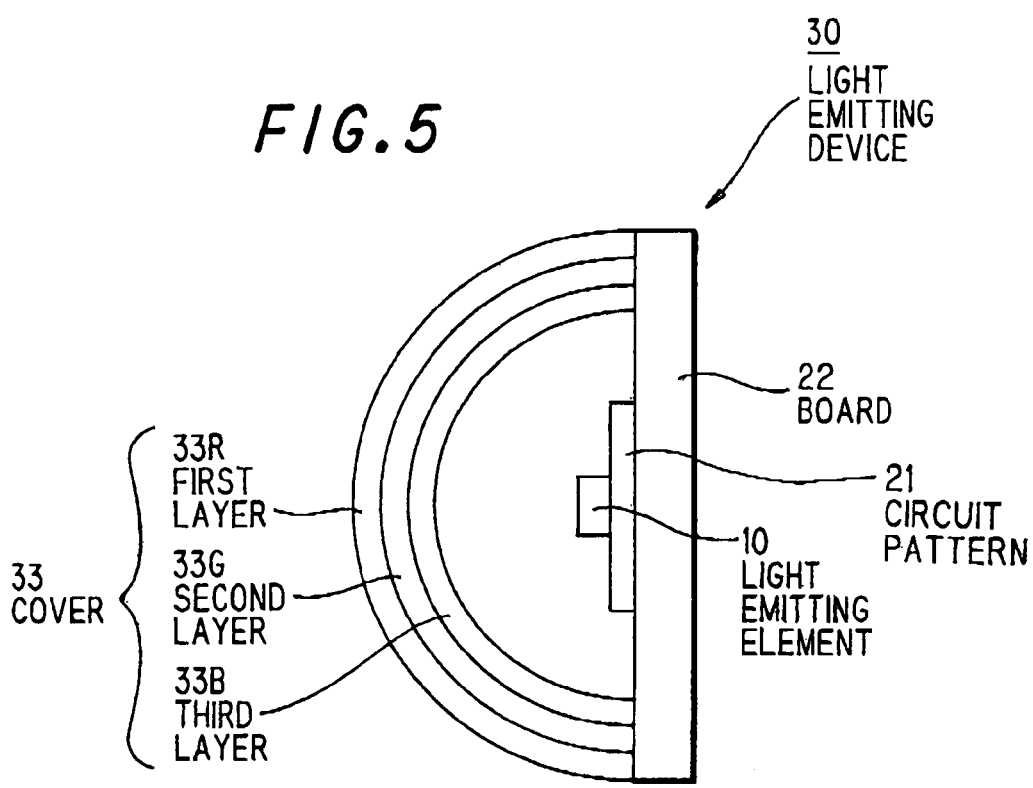
FIG. 5 is a side view showing a light emitting device in a second preferred embodiment of the invention.

FIG. 5 is a side view showing a light emitting device 30 in the second preferred embodiment of the invention. Like components are indicated by the same numerals used in FIG. 3.

As shown in FIG. 5, the light emitting device 30 is provided with a cover 33 composed of three layers (phosphor layer). A first layer 33R on the outer surface is of fluorophosphate glass with $Eu^{3+}$ doped therein (Lumilass R7(registered trade mark): SUMITA Optical Glass, Inc.), a second layer 33G at the center is of fluorophosphate glass with $Tb^{3+}$ doped therein (Lumilass G9(registered trade mark): SUMITA Optical Glass, Inc.), and a third layer 33B on the inner surface is of fluorophosphate glass with $Eu^{2+}$ doped therein (Lumilass B(registered trade mark): SUMITA Optical Glass, Inc.). The layers 33R, 33G and 33B are to generate red-system fluorescence, green-system fluorescence and blue-system fluorescence, respectively. By mixing these three-color fluorescence lights, white-system light can be radiated from the cover 33.

In the first and second embodiments, the shape of cover may be designed arbitrarily. When a rare-earth element as phosphor element is doped in the low-melting glass, the cover can be formed by molding. Thereby, a degree of freedom in designing can be further enhanced.

Third Embodiment

Figure 6:
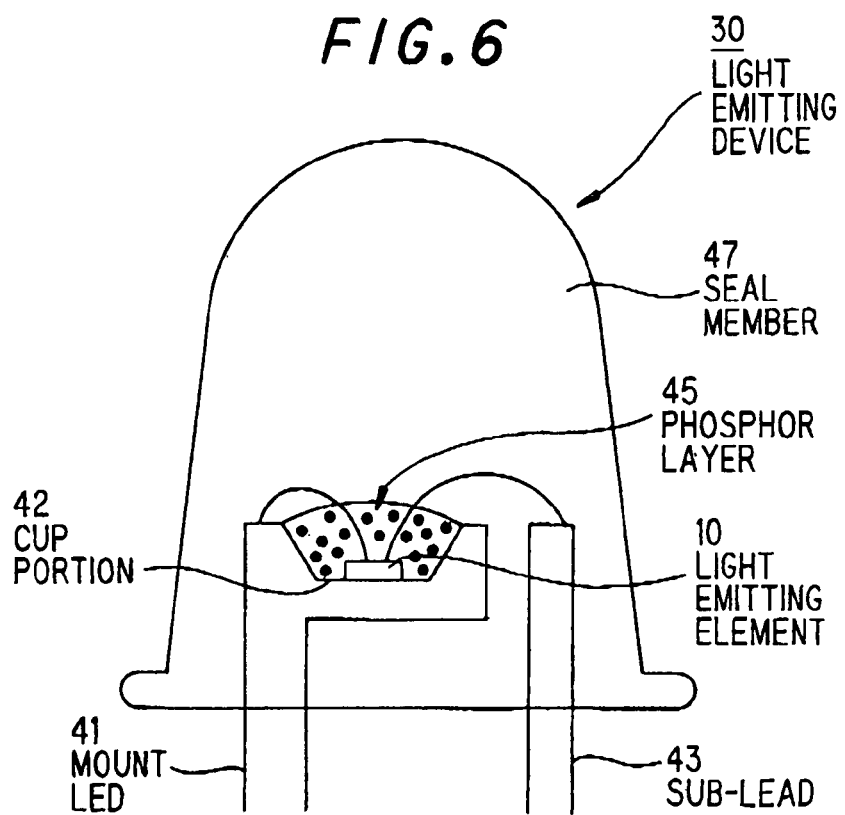
FIG. 6 is a cross sectional view showing a light emitting device in a third preferred embodiment of the invention.

FIG. 6 is a cross sectional view showing a light emitting device 40 in the third preferred embodiment of the invention.

In the light emitting device 40, the light emitting element 10 is disposed at the bottom of a cup portion 42 of a mount lead 41. The cup portion 42 is filled with a phosphor layer 45, and the mount lead 41 and sub-lead 43 are sealed with a lamp-shaped seal member 47.

Figure 7:
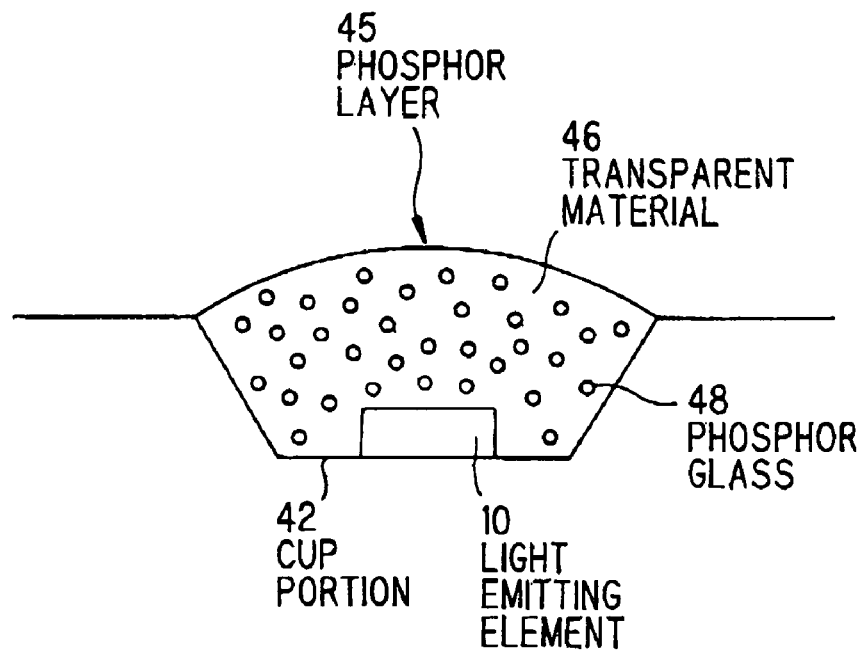
FIG. 7 is an enlarged cross sectional view showing a phosphor layer 45 and its vicinity in FIG. 6.

FIG. 7 is an enlarged cross sectional view showing the phosphor layer 45 and its vicinity in FIG. 6.

The phosphor layer 45 is composed of a transparent material 46 of epoxy resin etc. and ground phosphor glass particles 48, which are of fluorophosphate glass with $Tb^{3+}$ doped therein (Lumilass G9(registered trade mark): SUMITA Optical Glass, Inc.), being dispersed in the transparent material 46. Since the phosphor glass has a specific density that is not significantly greater than that of a general phosphor material such as YAG system phosphor, it can be evenly dispersed in the transparent material. The phosphor glass is not subjected to degradation due to moisture. Thus, the light emitting device has an excellent endurance.

Although in this embodiment the same kind of phosphor glass particles 48 are dispersed in the transparent material 46, phosphor glass particles with different emission colors may be dispersed therein. In such a case, although general phosphor materials with different emission colors are different one another in specific density, if the phosphor glass particles are composed of the same glass material so as to have the same specific density, they can be further equally mixed. Thereby, unevenness in emission color can be prevented.

Figure 8:
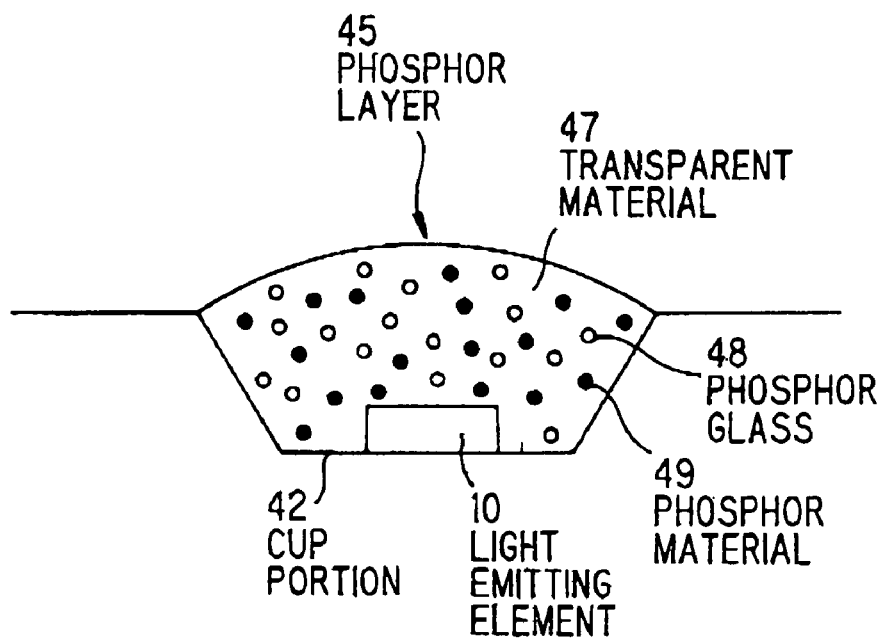
FIG. 8 is an enlarged cross sectional view showing a modification of phosphor layer 45 in FIG. 6.

FIG. 8 is an enlarged cross sectional view showing a modification of phosphor layer 45 in FIG. 6. As shown, a phosphor material 49 is dispersed in a transparent material 47 as well as phosphor glass particles 48. In this modification, the transparent material 47 of high-viscosity silicone resin is used to prevent the precipitation of phosphor material 49 with a high specific density.

On the other hand, a phosphor glass powder to generate red fluorescence may be added to a phosphor material short of red fluorescence element. Thereby, the color balance can be adjusted. Also, the light absorption in phosphor layer can be suppressed low since light except for light to be absorbed by the phosphor element is transmitted through the phosphor glass whereas the red phosphor material does not have a high emission efficiency and causes reflection and diffusion of light. Further, the color tone can be effectively stabilized since the red phosphor material does not have a high emission efficiency and is likely to be precipitated due to its specific density (about 6 to 7) higher than the other phosphor materials (about 3.8 for green phosphor materials and about 4.2 for blue phosphor materials) thereby causing a color separation.

Fourth Embodiment

FIG. 9 is a cross sectional view showing part of a light emitting device 50 in the fourth preferred embodiment of the invention.

In the light emitting device 50, the light emitting element 10 is mounted on the end of a mount lead 51. In FIG. 9, 52 is a sub-lead, and 56, 55 are bonding wires. In this embodiment, a phosphor layer 57 is composed of a matrix of low-melting glass 53 and ground phosphor glass particles 58, which are composed of fluorophosphate glass with $Eu^{3+}$ doped therein (Lumilass R7(registered trade mark): SUMITA Optical Glass, Inc.), fluorophosphate glass with $Tb^{3+}$ doped therein (Lumilass G9(registered trade mark); SUMITA Optical Glass, Inc.), and fluorophosphate glass with $Eu^{2+}$ doped therein (Lumilass B (registered trade mark): SUMITA Optical Glass, Inc.) being dispersed in the low-melting glass 53. The phosphor layer 57 is formed semicircular by press-molding the low-melting glass 53.

In the light emitting device 50, ultraviolet light emitted from the light emitting element 10 excites the ground phosphor glass particles 58, each of which generates red-system fluorescence, green-system fluorescence or blue-system fluorescence. By mixing these three-color fluorescence lights, white-system light can be radiated from the entire light emitting device 50.

Fifth Embodiment

FIG. 10 is a cross sectional view showing a light emitting device 60 in the fifth preferred embodiment of the invention.

The light emitting device 60 is composed of a light emitting element 10, a metallic stem 63 to mount the light emitting element 10 thereon, a housing 61 and a window 62 as phosphor layer. The window 62 is of fluorophosphate glass with $Tb^{3+}$ doped thinly therein.

In the light emitting device 60, when ultraviolet light emitted from the light emitting element 10 is transmitted through the window 62, phosphor glass to compose the window 62 generates thinly green fluorescence.

Since phosphor element ($Tb^{3+}$) in the phosphor glass radiates fluorescence to all directions, that fluorescence can be checked by eyes in the direction other than the optical axis. The phosphor glass has such a characteristic that light, of light emitted from the light emitting element 10, not to be absorbed by the phosphor element is directly passed through. Therefore, the emission of light emitting element 10 can be easily checked by eyes from the side of light emitting device 60. Ultraviolet light itself can be radiated outside without being affected in its light output and degree of convergence.

Figure 11:
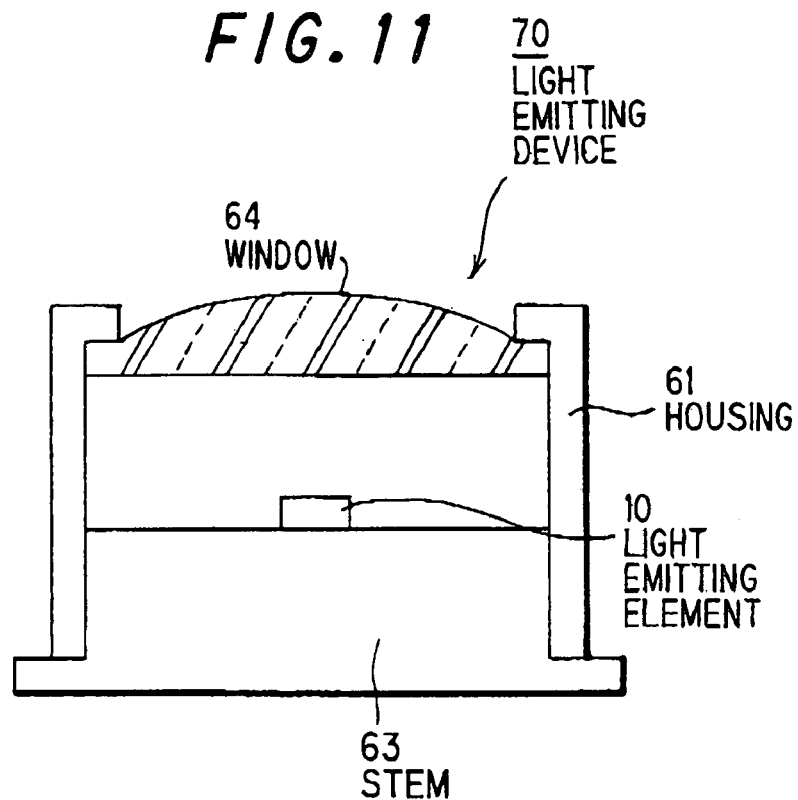
FIG. 11 is a cross sectional view showing a light emitting device as a modification of the fifth embodiment.

FIG. 11 is a cross sectional view showing a light emitting device 70 as a modification of the fifth embodiment.

The light emitting device 70 is provided with a convex lens-shaped window 64. Like components are indicated by the same numerals used in FIG. 10.

In the light emitting device 70, ultraviolet light emitted from the light emitting element 10 is converged by the window 64. Therefore, intensive ultraviolet light can be radiated in the optical axis direction. The emission spectrum of light emitting element 10 includes a bit of visible light region, though it mostly belongs to ultraviolet light region. Therefore, the turn-on state of light emitting element 10 can be checked by eyes and, however, it is undesirable to check the turn-on state from a convergence direction along the optical axis. In this embodiment, where the window 64 is composed of phosphor glass, the turn-on state of light emitting element 10 can be checked by observing fluorescence light to be radiated laterally from the window 64 while securing the safety.

Figure 12:
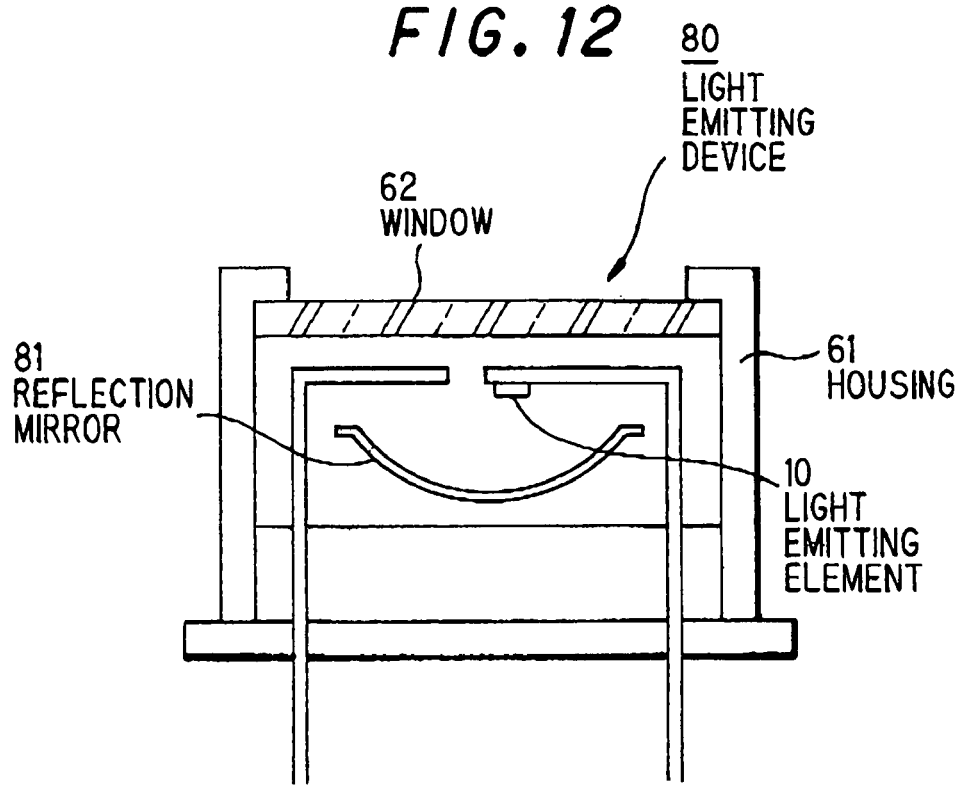
FIG. 12 is a cross sectional view showing a light emitting device as another modification of the fifth embodiment.

FIG. 12 is a cross sectional view showing a light emitting device 80 as another modification of the fifth embodiment. 81 is a reflection mirror. Like components are indicated by the same numerals used in FIG. 10.

Also in the light emitting device 80, the turn-on state of light emitting element 10 can be checked by observing fluorescence light to be radiated laterally from the window 62 while securing the safety since ultraviolet light emitted from the light emitting element 10 can be converged.

Although the light emitting device of this embodiment is provided with the window of phosphor glass, it is not necessarily provided with the window. Alternatively, it may be provided with a member to which light from the light emitting element 10 is irradiated and which is placed at a position where excited light of phosphor glass can be checked from outward.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light emitting device, comprising:
   a light emitting element to emit ultraviolet light;
   a phosphor layer that includes phosphor glass to generate fluorescence while being excited by the ultraviolet light emitted from the light emitting element; and
   an optical system to converge the ultraviolet light emitted from the light emitting element,
   wherein the light emitting element is disposed opposite the optical system, and the optical system is disposed in an optical axis direction of the light emitting element.

2. The light emitting device according to claim 1, wherein:
   the phosphor glass includes, as a glass component, at least one of $Tb^{3+}$ (terbium), $Eu^{2+}$ (divalent europium) and $Eu^{3+}$ (trivalent europium).

3. The light emitting device according to claim 1, wherein:
   the optical system comprises a convex lens.

4. The light emitting device according to claim 1, wherein:
   the phosphor layer includes a transparent material and particles including said phosphor glass that are dispersed in the transparent material.

5. The light emitting device according to claim 4, wherein:
   the particles including said phosphor glass include different kinds of phosphor glass.

6. The light emitting device according to claim 4, wherein:
   the phosphor layer includes a phosphor material other than the phosphor glass, the phosphor material being dispersed in the transparent material.

7. The light emitting device according to claim 1, wherein:
   the optical system comprises a reflection mirror.

8. The light emitting device according to claim 1, wherein:
   the phosphor glass comprises a low-melting phosphor glass doped with a fluorescence activation element.

9. The light emitting device according to claim 1, wherein:
   the phosphor glass comprises a fluorophosphate glass.

10. The light emitting device according to claim 1, wherein:
    the phosphor layer includes a plurality of layers including different kinds of phosphor glass.

11. The light emitting device according to claim 1, wherein:
    the optical system is disposed away from the light emitting element.

12. The light emitting device according to claim 1, wherein:
    the optical system comprises a reflection mirror that is disposed anteriorly in the optical axis direction of the light emitting element and away from the light emitting element, and
    the phosphor layer is disposed posteriorly in the optical axis direction of the light emitting element.

13. The light emitting device according to claim 1, wherein:
    the phosphor layer is disposed at a window of a housing in which the light emitting element is housed.

14. The light emitting device according to claim 1, wherein:
    the phosphor layer is disposed at a window of a housing in which the light emitting element is housed, and
    the phosphor layer is formed planar.

15. A light emitting device, comprising:
    a light emitting element; and
    a phosphor layer that includes phosphor glass to generate fluorescence while being excited by light emitted from the light emitting element,
    wherein the light emitting element emits ultraviolet light, and the phosphor glass generates visible fluorescence while being excited by the ultraviolet light, and the phosphor glass comprises a low-melting phosphor glass doped with a fluorescence activation element,
    wherein:
    the phosphor layer includes a plurality of layers including different kinds of phosphor glass.

* * * * *